(12) United States Patent
Yasuda

(10) Patent No.: US 6,208,011 B1
(45) Date of Patent: Mar. 27, 2001

(54) VOLTAGE-CONTROLLED POWER SEMICONDUCTOR DEVICE

(75) Inventor: Yukio Yasuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/325,383

(22) Filed: Jun. 4, 1999

(30) Foreign Application Priority Data

Dec. 9, 1998 (JP) .................................................. 10-349891

(51) Int. Cl.[7] .......................... H01L 29/00; H01L 29/866; H01L 29/861; H01L 31/107
(52) U.S. Cl. .......................... 257/551; 257/106; 257/199; 257/481; 257/603
(58) Field of Search .................................. 257/106, 199, 257/481, 551, 603, 605, 355

(56) References Cited

U.S. PATENT DOCUMENTS

| | | | |
|---|---|---|---|
| 5,502,338 | * | 3/1996 | Suda et al. .......................... 257/570 |
| 5,736,779 | * | 4/1998 | Kobayashi .......................... 257/603 |
| 5,821,586 | * | 10/1998 | Yamaguchi et al. .................. 257/355 |
| 5,959,345 | * | 9/1999 | Fruth et al. .......................... 257/605 |

FOREIGN PATENT DOCUMENTS

0773588A * 5/1997 (EP) .
402288366A * 11/1990 (JP) .
7-142711 6/1995 (JP) .

* cited by examiner

Primary Examiner—Mahshid Saadat
Assistant Examiner—Jesse A. Fenty
(74) Attorney, Agent, or Firm—Oblon, Spivak, McClelland, Maier & Neustadt, P.C.

(57) ABSTRACT

The present invention provides a power semiconductor device comprising a semiconductor substrate; a voltage-controlled transistor comprising a first electrode formed on the lower surface of the semiconductor substrate, a gate formed on the semiconductor substrate with a gate oxide interpolated in between and a second electrode formed on the semiconductor substrate; and a zener diode formed on the upper surface of the semiconductor substrate so as to be connected between the gate and the second electrode; wherein p-type regions and n-type regions alternately formed between the zener diode and the second electrode on the semiconductor substrate, a plurality of pad electrodes on the semiconductor substrate provided with the alternate p-type regions and n-type regions so as to allow one or not less than two diodes are series connected between the zener diode and the second electrode, and the distance between the adjacent pad electrodes is set so that when the diode is subjected to a current not less than a predetermined value, the respective pad electrodes are fused so that short-circuiting occurs between the adjacent pad electrodes.

6 Claims, 10 Drawing Sheets

VOLTAGE-CONTROLLED POWER SEMICONDUCTOR DEVICE

BACKGROUND OF THE INVENTION

1. Field of the Invention

The present invention relates to a power semiconductor device of a voltage-controlled transistor, such as power MOS field effect transistor (power MOSFET) and insulating gate bipolar transistor (IGBT).

2. Description of the Prior Art

The voltage-controlled power semiconductor devices include, for example, power MOS field effect transistors and insulating gate bipolar transistors, and each of them is provided with a gate oxide as its essential constituent element. FIG. 12 is a sectional view showing the construction of a power MOS field effect transistor of the prior art, and FIG. 13 shows its equivalent circuit. As illustrated in FIG. 12, the conventional power MOS field effect transistor is, for example, formed as follows: On an $n^+$ substrate 1 made of n-type silicon, an $n^+$ epitaxial layer 3 formed by n-type silicon subjected to epitaxial growth, a p-type region 4 formed by diffusing p-type impurities in the $n^+$ epitaxial layer 3 and $n^+$ source region 5 formed by diffusing n-type impurities therein are stacked, and on these layers, a gate 7, insulated by a gate oxide 6 made of, for example, oxide silicon, is formed and Al conductor 8 serving as a source electrode is further formed. Moreover, in the power MOS field effect transistor of the prior art as shown in FIG. 12, n-type polysilicon layers 9 and p-type polysilicon layers 10 alternately placed by using polycrystalline silicon (polysilicon) used at the time of forming the gate electrode so that n-number of zener diodes d11, d12, . . . , d1n are formed, thereby preventing a high voltage, which might cause breakdown of the insulation of the gate oxide 6, from being applied to the gate oxide 6.

The power MOS field effect transistor, configured as described above, is allowed to carry out switching operations by turning ON/OFF the gate voltage. In general, since this gate oxide is a comparatively thin film, if there is any defect in the gate oxide, dielectric breakdown tends to occur at the corresponding portion, causing breakdown of the device. For this reason, in general, after devices have been manufactured, a voltage, which is higher than the actually used voltage, is applied between the gate and source, thereby breaking and eliminating (screening) those originally weak devices containing any defect in the gate oxide; thus, only the devices having sufficient reliability can be shipped. Moreover in recent years, there have been demands for devices having a low switching voltage, and in response to these demands, attempts to reduce the switching voltage have been made by making the thickness of the gate oxide thinner or reducing the diffusion concentration (impurity concentration). As the gate oxide is made thinner, the dielectric breakdown voltage of the gate oxide is lowered, with the result that the possibility of breakdown due to defects, etc. occurring upon formation of the gate oxide become higher; therefore, more effective screening is required. Moreover, besides the power MOSFETs, power semiconductor devices of the voltage-control type include insulation gate bipolar transistors (IGBT), and the IGBT is also provided with a gate insulator in the same manner as the power MOSFET and normally with zener diodes, and therefore requires effective screening during its production process.

However, in the voltage-controlled power semiconductor device, since zener diodes are generally formed therein as described above, the voltage used for screening is set as low as possible, while the voltage of protection-use zener diodes has to be set to a voltage higher than the screening voltage. For this reason, in the conventional power semiconductor devices, it is not possible to apply any voltage exceeding a predetermined value to the gate oxide, resulting in failure to carry out an effective screening.

For example, in a power semiconductor device, in the case when zener diodes, which have a voltage-current characteristic as shown in FIG. 14, are formed as a protection circuit, upon receipt of an excessive current such as a surge, the gate oxide is subjected to a voltage application corresponding to the withstanding voltage VBG of the zener diodes plus the value of the voltage drop. Therefore, even in the case of screening by the use of a voltage not more than the withstanding voltage VBG, there is a possibility that the device might be broken by a voltage not more than the withstanding voltage VBG even though the zener diodes are provided.

Moreover, when the withstanding voltage VGB of the zener diodes is set lower, the voltage that can be applied upon screening has to be further lowered, with the result that it becomes more difficult to eliminate the initially defective products.

SUMMARY OF THE INVENTION

That is, an object of the present invention is to provide a voltage-controlled power semiconductor device with high reliability, which allows elimination of initially defective products with ease and can sufficiently protect the gate oxide in use.

In order to solve the object described above, the present invention provides a power semiconductor device comprising a semiconductor substrate; a voltage-controlled transistor having a first electrode formed on the lower surface of the semiconductor substrate, a gate insulated by a gate oxide formed on said semiconductor substrate and a second electrode formed on the semiconductor substrate; and a zener diode formed on the upper surface of the semiconductor substrate so as to be connected between the gate and the second electrode; wherein p-type regions and n-type regions alternately formed between the zener diode and the second electrode on the semiconductor substrate, a plurality of pad electrodes on the semiconductor substrate provided with the alternate p-type regions and n-type regions so as to allow one or not less than two diodes are series connected between the zener diode and the second electrode, and the distance between the adjacent pad electrodes is set so that when the diode is subjected to a current not less than a predetermined value, the respective pad electrodes are fused so that short-circuiting occurs between the adjacent pad electrodes.

With such a construction, after production, screening can be carried out by using a voltage not less than the withstanding voltage of the zener diode, and successively, by applying a current not less than a predetermined value to the respective diodes, the respective pad electrodes are fused, thereby causing short-circuiting between the adjacent pad electrodes. Consequently, it becomes possible to protect the gate insulator by using the diode characteristics of the zener diode.

Therefore, in the present invention, since the screening can be carried out by using a comparatively high voltage, it is possible to provide a voltage-controlled power semiconductor device with high reliability, which allows elimination of initially defective products with ease and can sufficiently protect the gate oxide in use.

Moreover, in the power semiconductor device of the present invention, in order to carry out screening in the off state of the voltage-controlled transistor, it is preferable to set the polarity of the respective diodes be the same as the polarity of the zener diode.

In the power semiconductor device of the present invention, by setting the respective diodes to have the same polarity as that of the zener diodes, screening can be carried out in the OFF state of the voltage control transistor, thereby making it possible to reduce power consumption at the time of screening.

Moreover, in the power semiconductor device of the present invention in which a plurality of diodes are provided, it is preferable to set the adjacent diodes to have polarities revered to each other. With this arrangement, screening can be carried out by applying either of the positive and negative voltages and consequently to carry out screening with ease.

Furthermore, in the power semiconductor device of the present invention, the gate can be made from polysilicon, and the p-type regions and the n-type regions are formed by using polysilicon that is formed simultaneously upon formation of the gate; thus, it becomes possible to simplify the manufacturing processes, and consequently to allow production at low costs.

Furthermore, in the power semiconductor device of the present invention, an MOS field effect transistor can be used as the voltage-controlled transistor, thereby providing easier manufacturing processes.

Furthermore, in the power semiconductor device of the present invention, an insulating bipolar transistor can be used as the voltage-controlled transistor, thereby providing devices that can be used in a wider range of applications.

DETAILED DESCRIPTION OF THE PREFERRED EMBODIMENTS

Now preferred embodiments of the present invention will be described below with reference to the accompanying drawings.

Embodiment 1

Figure 1:
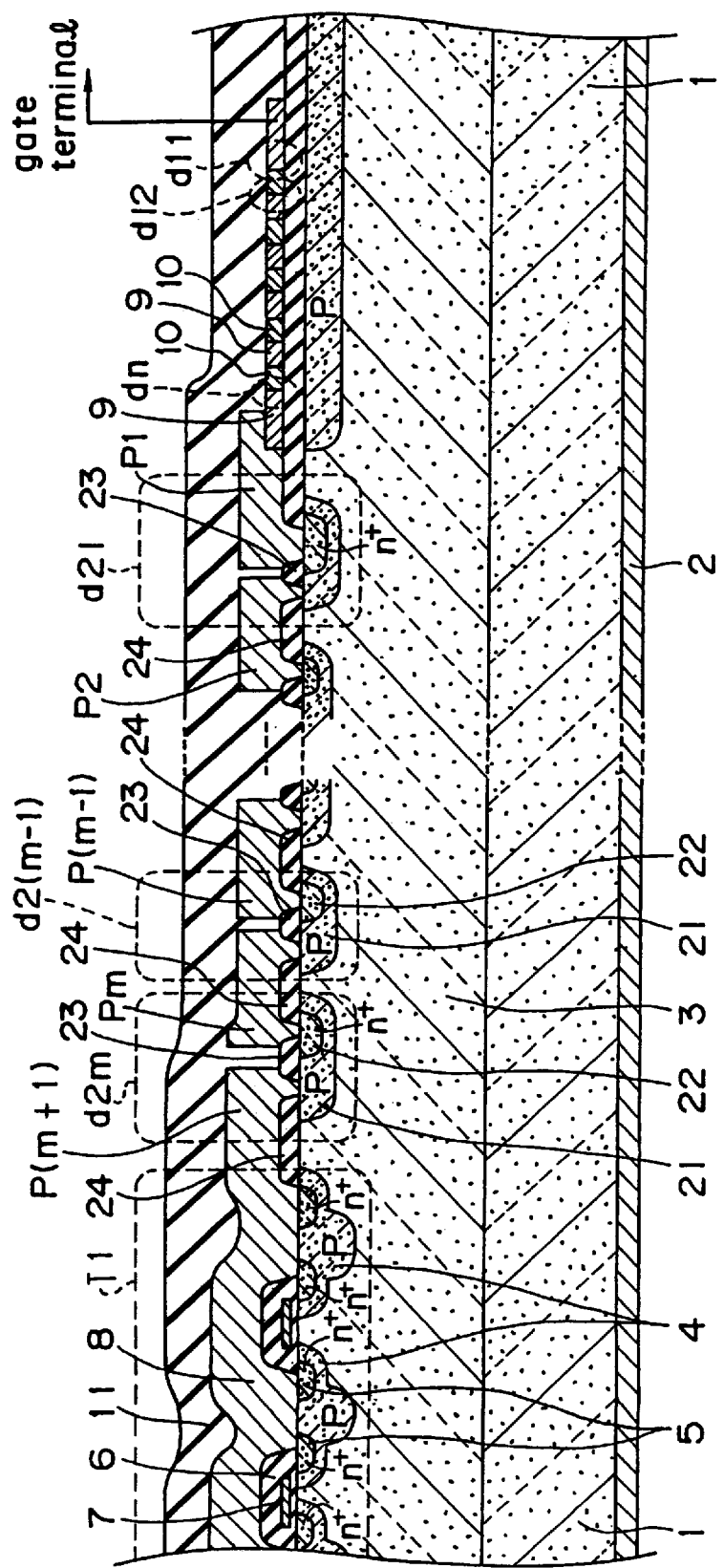
FIG. 1 is a sectional view showing the construction of the power semiconductor device according to the fist embodiment of the present invention.
Figure 12:
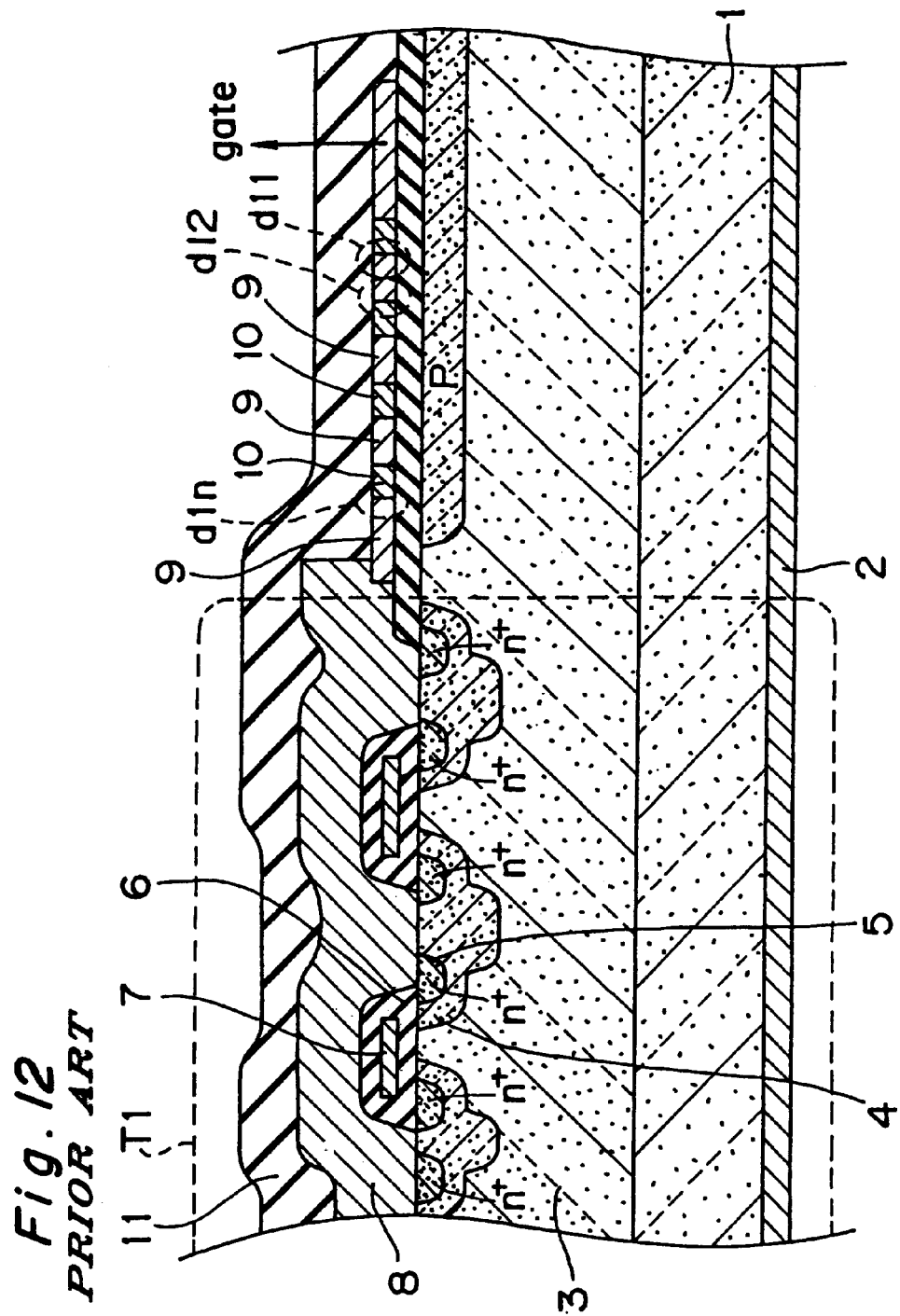
FIG. 12 is a sectional view showing the construction of the power semiconductor device of the prior art.
Figure 13:
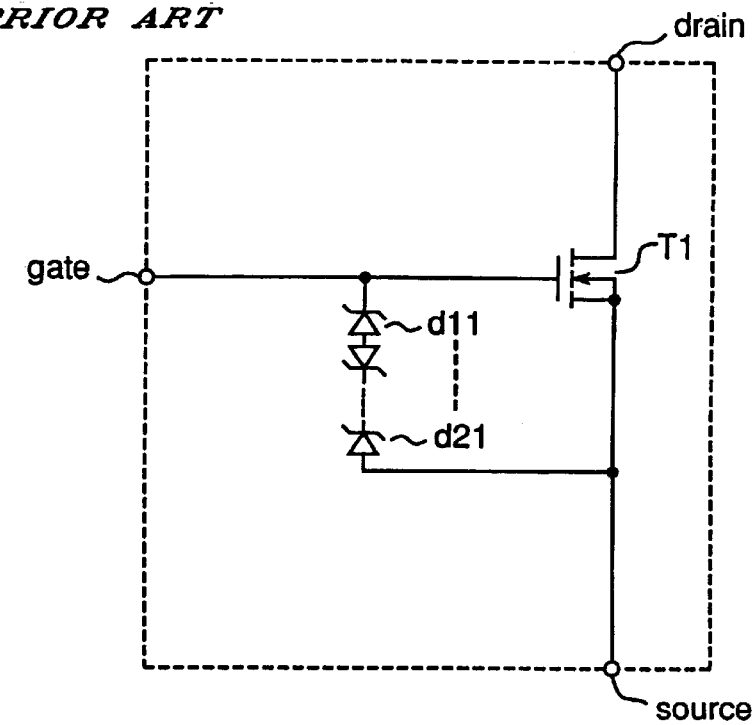
FIG. 13 is a circuit diagram showing an equivalent circuit of the power semiconductor device of the prior art.
Figure 14:
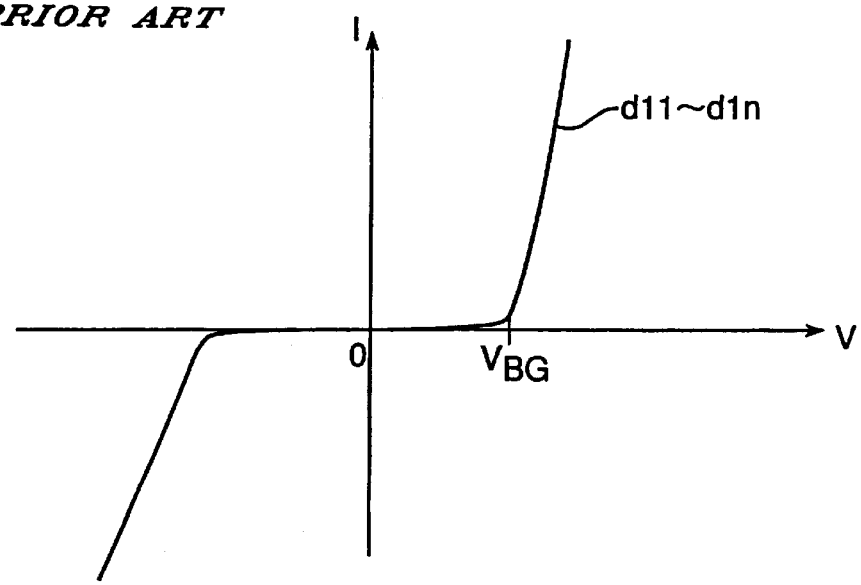
FIG. 14 is a graph showing diode characteristics in the power semiconductor device of the prior art.

As illustrated in FIG. 1, the voltage-controlled power semiconductor device of the first embodiment of the present invention, which is a power MOS field effect transistor similar to a conventional power MOS field effect transistor as shown in FIG. 12, is characterized in that a plurality of diodes d21, d22, . . . , d2m are formed between a transistor T1 and zener diodes d11, d12, . . . , d1n, and the other parts are configured in the same manner as the conventional power MOS field effect transistor of FIG. 12. In FIG. 1, those parts that are the same as FIG. 12 are indicated by the same reference numerals. The transistor T1 is controlled by voltage.

More specifically, on an $n^+$ epitaxial layer 3 located between the transistor T1 and the zener diodes d11, d12, . . . , d1n, a plurality of p-type regions 21 are formed by diffusing p-type impurities with predetermined intervals, and n-type regions ($n^+$ regions) 22 are formed by diffusing n-type impurities in one part of each of the p-type regions 21. On this are formed insulating films 23 and insulating films 24 alternately as illustrated in FIG. 1 so that pad electrodes p1, p2, p3, . . . , pm, each separated on each insulating film 23, are formed; thus, diodes d21, . . . , d2(m−1), d2m are formed. In other words, the pad electrodes p1, p2, p3, . . . , pm are formed so as to connect the anode of diode d2k and the cathode of diode d2(k+1) that adjacent to each other. Here, pad electrode p(m+1) is formed on one end of a source electrode 8 in a manner so as to be connected to the source electrode 8.

Figure 2:
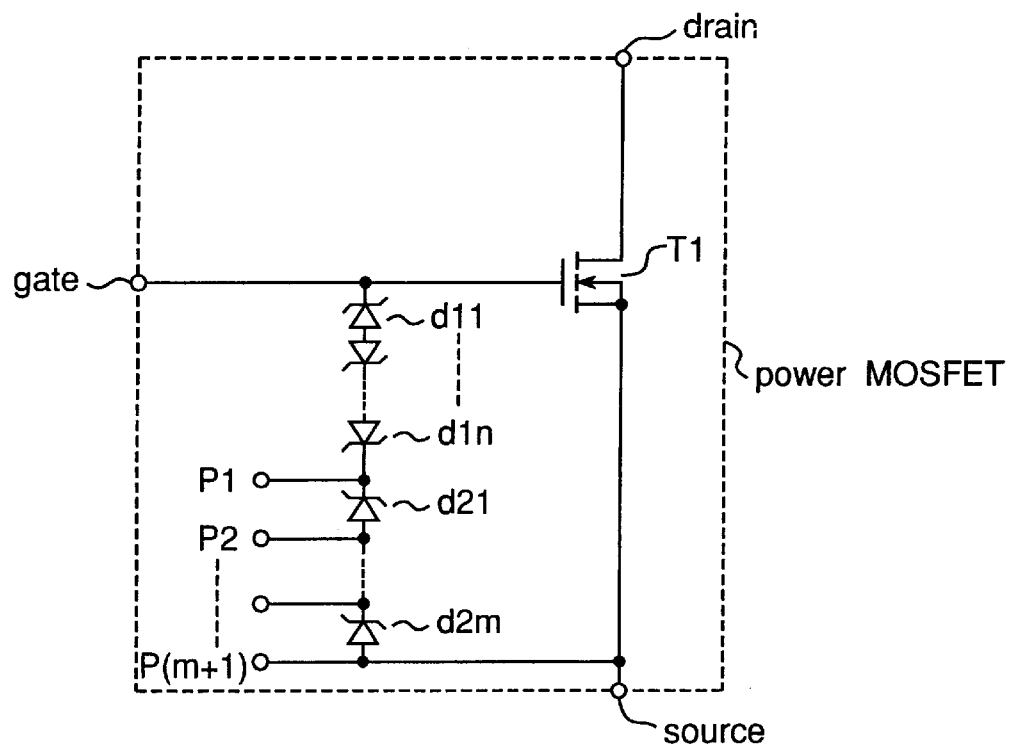
FIG. 2 is a circuit diagram showing an equivalent circuit of the power semiconductor device of first embodiment.

In other words, as shown in an equivalent circuit in FIG. 2, the diodes d21, d22, . . . , d2m are connected in series between the gate and source on the side closer to the source electrode.

Here, in the equivalent circuit of FIG. 2, these are provided with terminals having the same reference numerals as the pad electrodes p1, p2, p3, . . . , p(m+1).

Figure 3:
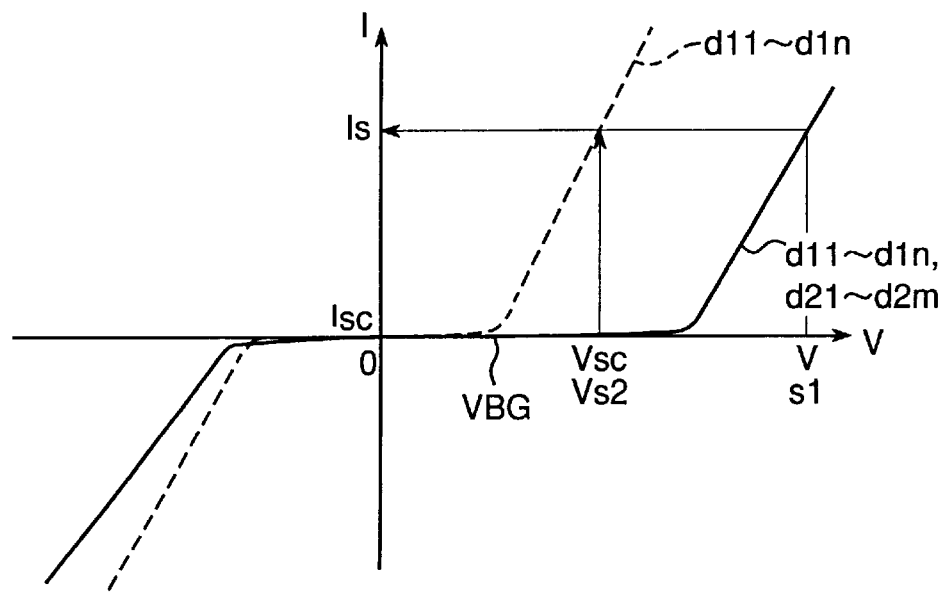
FIG. 3 is a graph showing diode characteristics in the power semiconductor device of the first embodiment.

In the voltage-controlled power semiconductor device of the first embodiment having the above-mentioned construction, characteristics obtained by series-connecting the diodes are shown in FIG. 3. In FIG. 3, the characteristic indicated by a solid line is a current-voltage characteristic obtained when all the zener diodes d11 through d1n and the diodes d21 through d2m are series-connected, and the characteristic indicated by a broken line is a current-voltage characteristic obtained when the zener diodes d11 through d1n are series-connected.

Therefore, the voltage-controlled power semiconductor device of the first embodiment having the construction as described above makes it possible to carry out screening by using a screen voltage Vsc not less than the withstanding voltage VBG at the time of series-connecting the zener diodes d11 through d1n.

Moreover, in the voltage-controlled power semiconductor device of the present the first embodiment, after carrying out the screening by using the screen voltage Vsc not less than the withstanding voltage VBG, an excessive current is respectively applied between the pad electrode p1 and the pad electrode p2, between the pad electrode p2 and the pad electrode p3, . . . , as well as between the pad electrode pm and the pad electrode p(m+1) so that the temperature of each pn junction rises to fuse each of the pad electrodes pk(k=1, 2, . . . , m+1). Consequently, short-circuiting occurs at each of the gaps between the pad electrodes due to fusing, thereby forming a construction between the gate and source of the transistor T1, in which the zener diodes d11 through d1$n$ are series-connected; thus, it becomes possible to prevent application of voltage not less than the withstanding voltage VBG to the gate insulator 6. Here, an alloy layer of Al and Si is formed at each of the portions having been subjected to short-circuiting, and this short-circuiting state is maintained permanently.

As described above, the voltage-controlled power semiconductor device of the first embodiment makes it possible to carry out screening by using a voltage not less than the withstanding voltage VBG at the time of all the zener diodes d11 through d1$n$ are series-connected, and also to prevent application of a voltage not less than the withstanding voltage VBG to the gate insulator 6 during the actual operation.

For example, as shown in FIG. 3, a voltage generated when a surge current Is flows therein is Vs2 during the actual operation, while it is represented by Vs1 before short-circuiting occurs due to fusing between the pad electrodes. In other words, in the present the first embodiment, it is possible to maintain the surge voltage occurring in response to the surge current at the same level as the conventional construction shown in FIG. 12 during the actual operation.

As described above, in the first embodiment, during the screening, a circuit, which is made by series-connecting the zener diodes d11 through d1$n$ as well as the diodes d21 the d2$m$, serves as a protection circuit, and during the normal operation, a circuit, which is made by series-connecting the zener diodes d11 through d1$n$, and operated by a low voltage, serves as the protection circuit during the normal operation. In this manner, in the voltage-controlled power semiconductor device of the first embodiment, by switching the withstanding voltages of the protection circuit between the screening time and the actual operation time, it becomes possible to carry out an effective screening operation, and also to protect the transistor T1 (gate insulator 6) when a comparatively low voltage is applied during the actual operation. Therefore, high reliability is ensured.

Embodiment 2

Now second embodiment according to the present invention will be described.

Figure 4:
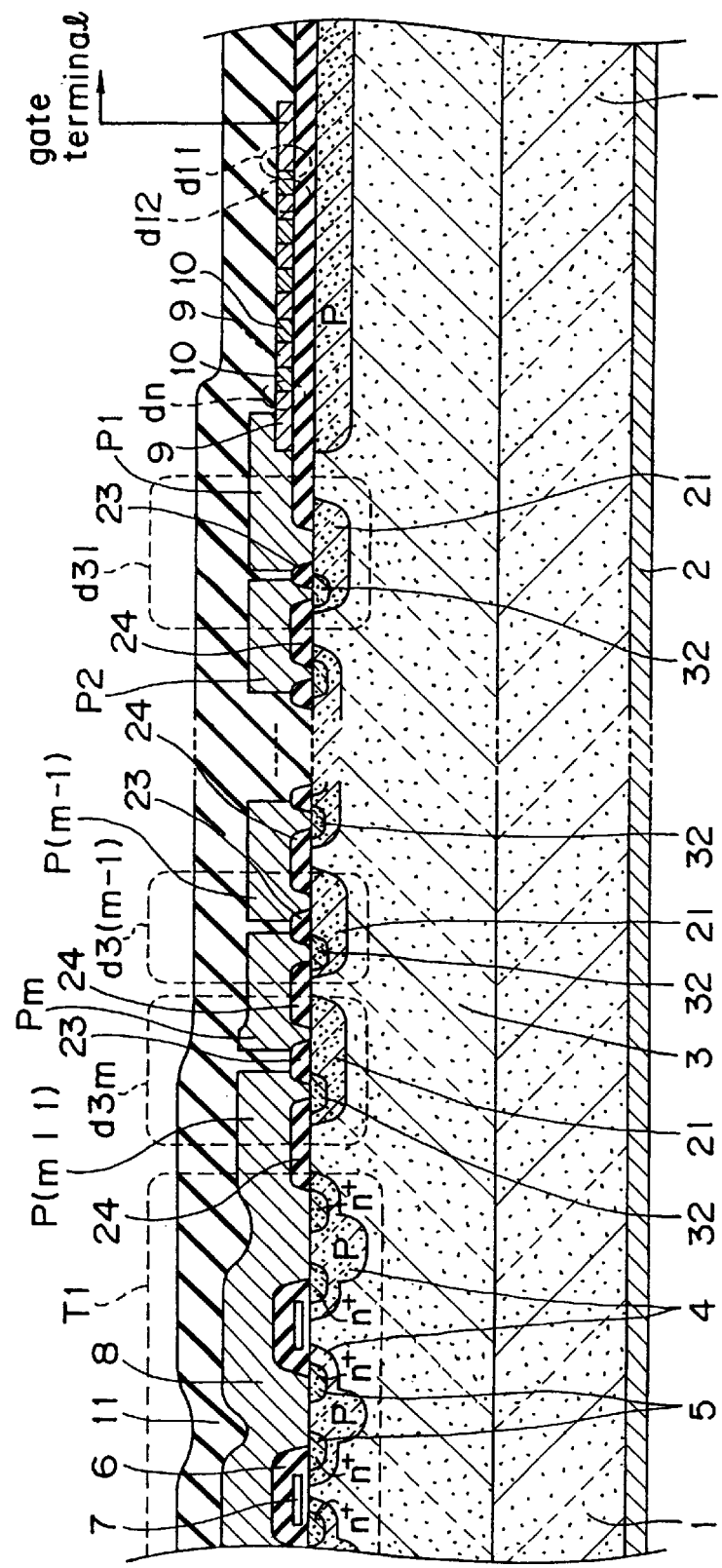
FIG. 4 is a sectional view showing the construction of the power semiconductor device according to the second embodiment of the present invention.

As illustrated in FIG. 4, the voltage-controlled power semiconductor device of the second embodiment of the present invention, which is a power MOS field effect transistor similar to a conventional power MOS field effect transistor of the first embodiment as shown in FIG. 1, is configured in the same manner as the first embodiment of FIG. 1 except that, instead of the respective diodes d21, d22, . . . , d2$m$, diodes d31, d32, . . . , d3$m$ are formed. In FIG. 4, those parts that are the same as FIG. 1 are indicated by the same reference numerals.

Figure 5:
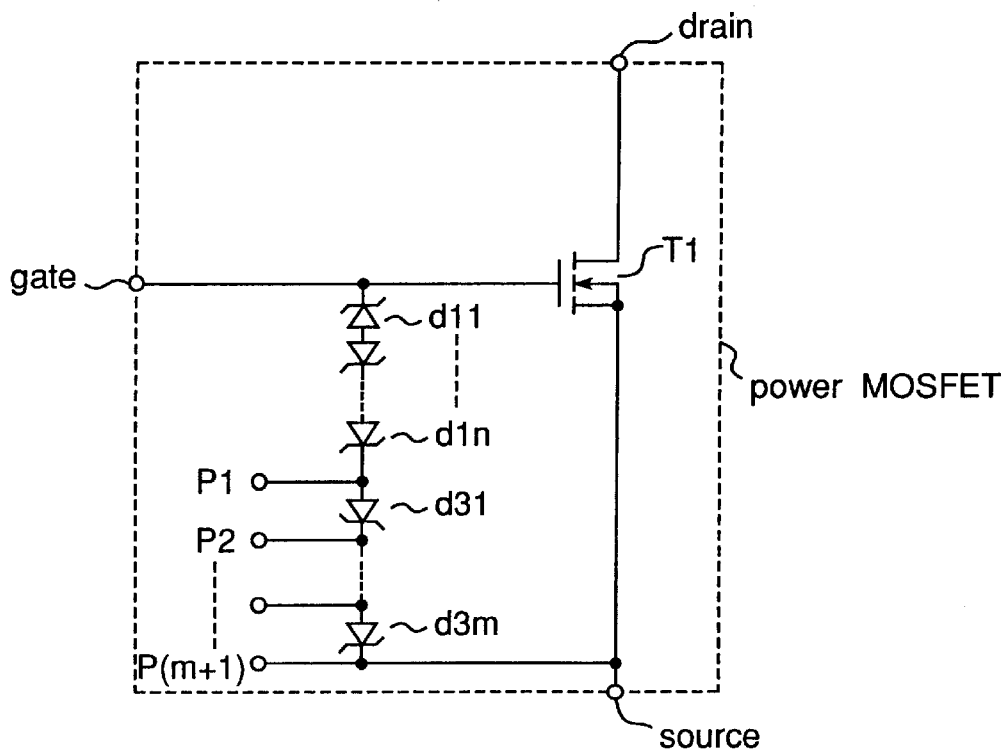
FIG. 5 is a circuit diagram showing an equivalent circuit of the power semiconductor device of the second embodiment.

More specifically, on an n$^+$ epitaxial layer 3 located between the transistor T1 and the zener diodes d11, d12, . . . , d1$n$, a plurality of p-type regions 21 are formed by diffusing p-type impurities with predetermined intervals, and n-type regions (n$^+$ regions) 32 are formed by diffusing n-type impurities in one part of each of the p-type regions 21. On this are formed insulating films 23 and insulating films 24 alternately as illustrated in FIG. 1 so that pad electrodes p1, p2, p3, . . . , pm, each separated on each insulating film 23, are formed; thus, diodes d31, . . . , d3(m−1), d3$m$ are formed. As can be clearly seen by comparing FIG. 4 with FIG. 1, in the p-type regions of the second embodiment, the position of formation of each n-type region (n$^+$ region) 32 is different from the position of formation of each n-type region (n$^+$ region) 22 of the first embodiment. Thus, as illustrated by an equivalent circuit in FIG. 5, in the power-control type power semiconductor device of the second embodiment, the diodes d31, d32, , . . . , d3$m$ are designed so as to have a polarity reversed to that of the diodes d21, d22, . . . , d2$m$ of the first embodiment.

The power-control type power semiconductor device of second embodiment has the same effects as the first embodiment, and also has the following advantages:

In the case of the first embodiment, since the gate is biased by a positive voltage upon carrying out screening, the N channel power MOSFET is maintained in the ON state. At this time, when screening is carried out with the drain conducting, the potential of the n$^-$ epitaxial layer 3 is short-circuited to the source since the power MOSFET is in the ON state. In this state, since the p-type regions 21 of the diodes d21 through d2$n$ and the pn junction of the epitaxial layer 3 are biased in the forward direction, the screen voltage is allowed to increase only to the voltage that is applicable to the pn junction in the forward direction. Therefore, upon carrying out screening, a positive voltage has to be applied to the drain so that the pn junction between the p-type regions 21 and the n$^-$ epitaxial layer 3 is not biased in the forward direction.

Consequently, in the case of a high power-driving capability of the power MOSFET, since an extremely great current flows between the drain and source upon carrying out screening, an extremely great power is required as a whole when a plurality of devices are subjected to screening at one time.

Figure 6:
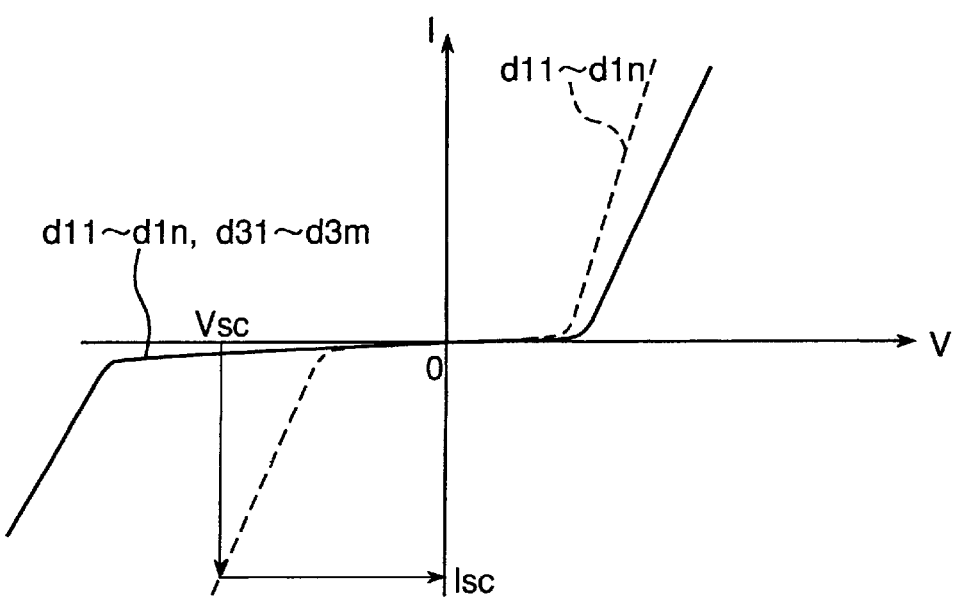
FIG. 6 is a graph showing diode characteristics in the power semiconductor device of the second embodiment.

In contrast, different from the first embodiment, the voltage-controlled power semiconductor device is designed so that the diodes d31 through d3$m$ having the reversed polarity to the polarity of the diodes d21 through d2$m$ are formed; therefore, the diode characteristic obtained by series-connecting the zener diodes d11 through d1$n$ as well as the diodes d31 through d3$m$ is indicated by a solid line in FIG. 6, which allows screening by applying a negative voltage between the gate and source. By applying a negative voltage between the gate and source upon screening, the screening is carried out while the power MOSFET is in the OFF state. Consequently, a plurality of devices can be screened simultaneously without the need for a great power.

Embodiment 3

In the aforementioned first and second embodiments, the diodes d21 through d2$m$ as well as the diodes d31 through d3$m$ are provided by forming the p-type regions 21 and n-type regions 22 or 32 on the n$^-$ epitaxial layer 3. However, the third embodiment gives an example in which diodes d41 through d4$m$ are formed by using polysilicon that is used upon forming the gate electrode. The voltage-controlled power semiconductor device of the third embodiment has the same construction as the first and second embodiments except that, instead of the diodes d21 through d2$m$ or the diodes d31 through d3$m$, the diodes d41 through d4$m$ are formed.

Figure 7:
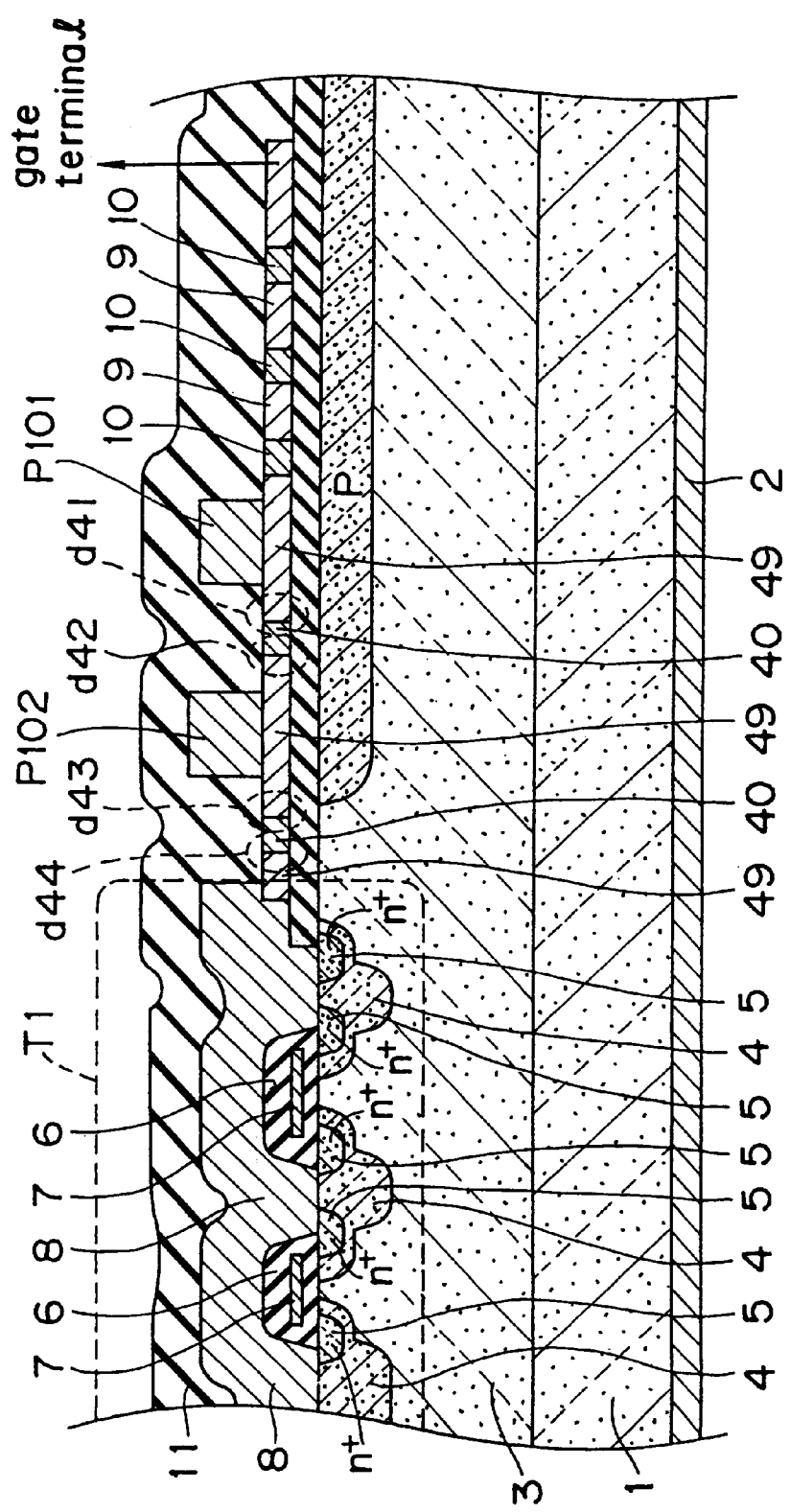
FIG. 7 is a sectional view showing the construction of the power semiconductor device according to the third embodiment of the present invention.

In other words, as illustrated in FIG. 7, in the voltage-controlled power semiconductor device of the third embodiment, p-type regions 40 and n-type regions (n$^+$ regions) 49 alternately formed in the polysilicon layer located between the transistor T1 and the zener diodes d11 through d1$n$ so that pad electrodes p101 and p102 are formed on the respective n-type regions 49; thus, diodes d41, d42, d43 and d44 are provided. Here, FIG. 7 exemplifies a case in which four diodes d41, d42, d43 and d44 are formed. However, the third embodiment is not intended to be limited by the number, four, and m-number of diodes may be provided as shown in FIG. 8.

Figure 8:
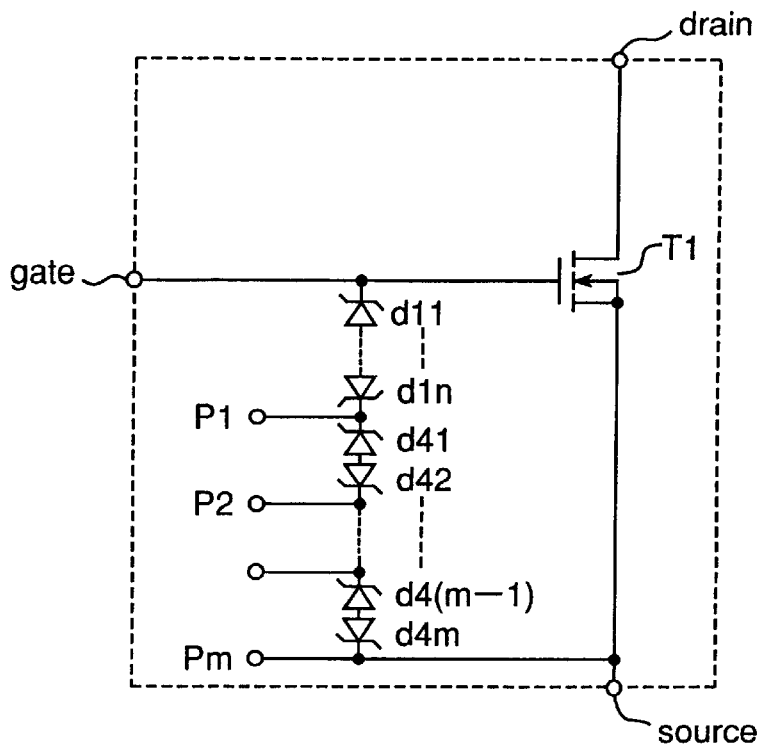
FIG. 8 is a circuit diagram showing an equivalent circuit of the power semiconductor device of the third embodiment.
Figure 9:
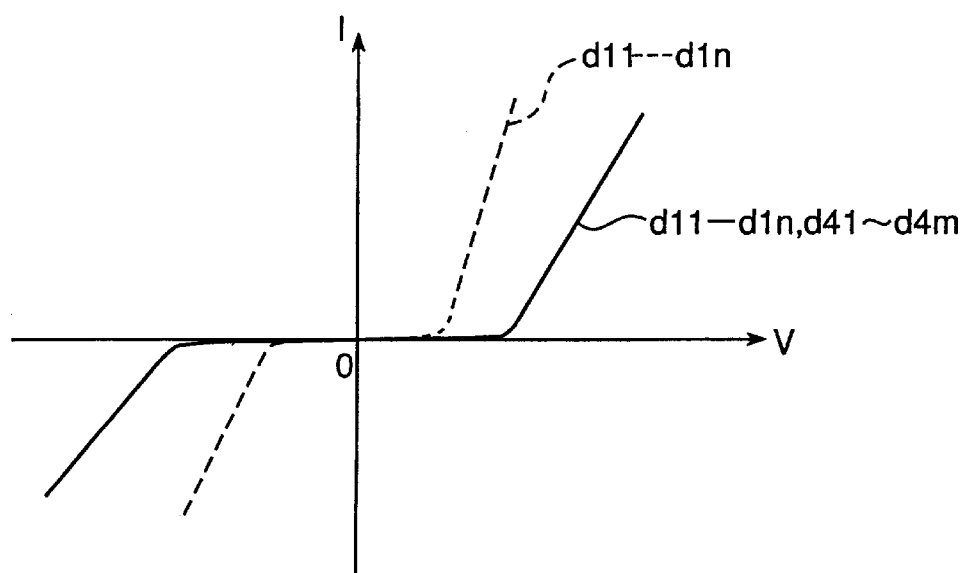
FIG. 9 is a graph showing diode characteristics in the power semiconductor device of the third embodiment.

In the voltage-controlled power semiconductor device of the third embodiment having the above-mentioned construction, as illustrated in FIG. 8, the respective pairs of the diode d41 and diode d42, the diode d43 and diode d44, ..., the diode d4(m−1) and diode d4$m$ are designed so as to have polarities reversed to each other. Therefore, in the third embodiment configured as described above, the diode characteristic as a whole obtained by series-connecting the zener diodes d11 through d1$n$ as well as the diodes d41 through d4$m$ is indicated by a solid line in FIG. 9. Therefore, the voltage-controlled power semiconductor device of the third embodiment exhibits the same functions and effects as the first and second embodiments, and also allows screening by the use of either of positive and negative voltages.

Embodiment 4

The voltage-controlled power semiconductor device accordance to the fourth embodiment of the present invention will be described below. The voltage-controlled power semiconductor devices of the first to third embodiments exemplified cases in which the power MOS field effect semiconductor device was used, and the voltage-controlled power semiconductor device of the forth embodiment, on the other hand, exemplifies a case in which the insulating gate bipolar transistor (IGBT) is used.

Figure 10:
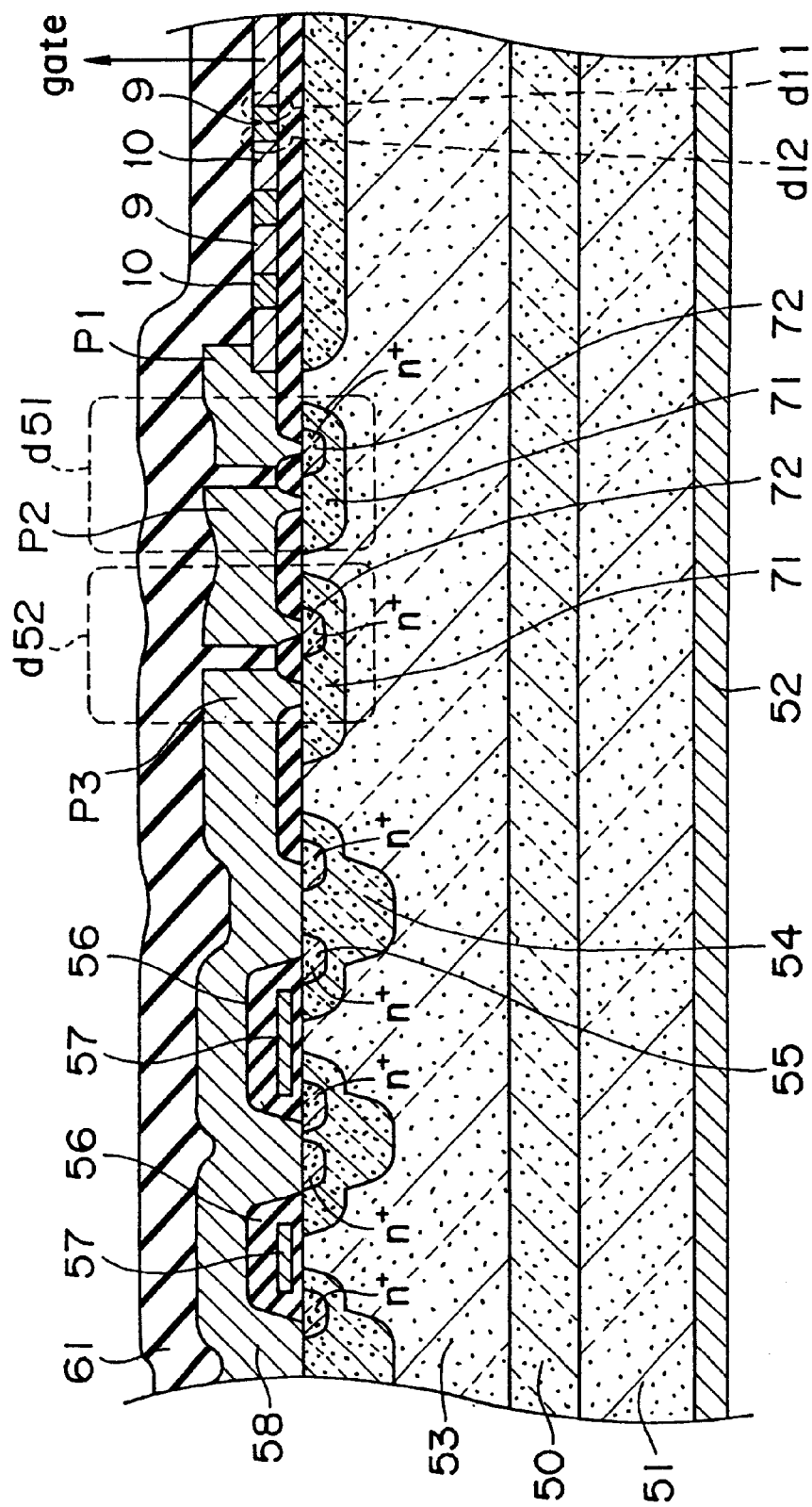
FIG. 10 is a sectional view showing the construction of the power semiconductor device according to the fourth embodiment of the present invention.

As illustrated in FIG. 10, in the voltage-controlled semiconductor device of the fourth embodiment, for example, on a p$^+$ substrate 51 made of p-type silicon, an n$^+$ buffer layer 50 which is made of n-type silicon that contains comparatively more n-type impurities and that has been subjected to epitaxial growth, and an n$^-$ epitaxial layer 53, which is made of n-type silicon that contains comparatively less n-type impurities and that has been subjected to epitaxial growth, is formed on the n$^+$ buffer layer 50. Further, in the n$^-$ epitaxial layer 53, p-type regions 54 formed by diffusing p-type impurities and n$^+$ emitter regions 55 formed by diffusing n-type impurities are formed, and on this is formed a gate 57 constituted by a gate oxide 56 made of, for example, oxide silicon, and on this is further formed Al conductor 58 that forms emitter electrodes. Moreover, in the voltage-controlled power semiconductor device of the fourth embodiment shown in FIG. 10, by using polycrystal silicon (polysilicon) used upon forming the gate electrode, n-type polysilicon layers 9 and p-type polysilicon layers 10 alternately installed so as to form n-number of zener diodes d11, d2, ..., d1$n$, and diodes are formed between these zener diodes and a transistor T2 in a manner as described below.

In other words, a plurality of p-type regions 71 are formed by diffusing p-type impurities with predetermined intervals on the n$^-$ epitaxial layer 53 positioned between the transistor T2 and the zener diodes d11, d12, ..., d1$n$, and n$^+$ regions 72 are formed by diffusing n-type impurities in one portion of each of the p-type regions 71. Then, on this are formed insulating films 73 and insulating films 74 alternately as shown in FIG. 1 so that pad electrodes p1, p2 and p3, each separated on each of the insulating films 73, are formed; thus, diodes d51, d52 and d53 are formed. Here, the pad electrode p3 is formed at one end of the emitter electrode 58 in a manner so as to be connected to the emitter electrode 58. Additionally, FIG. 10 exemplifies a case in which three diodes d51, d52 and d53 are formed; however, the present embodiment is not intended to be limited by the number, 3, and one or m-number of diodes may be installed as shown in FIG. 11.

Figure 11:
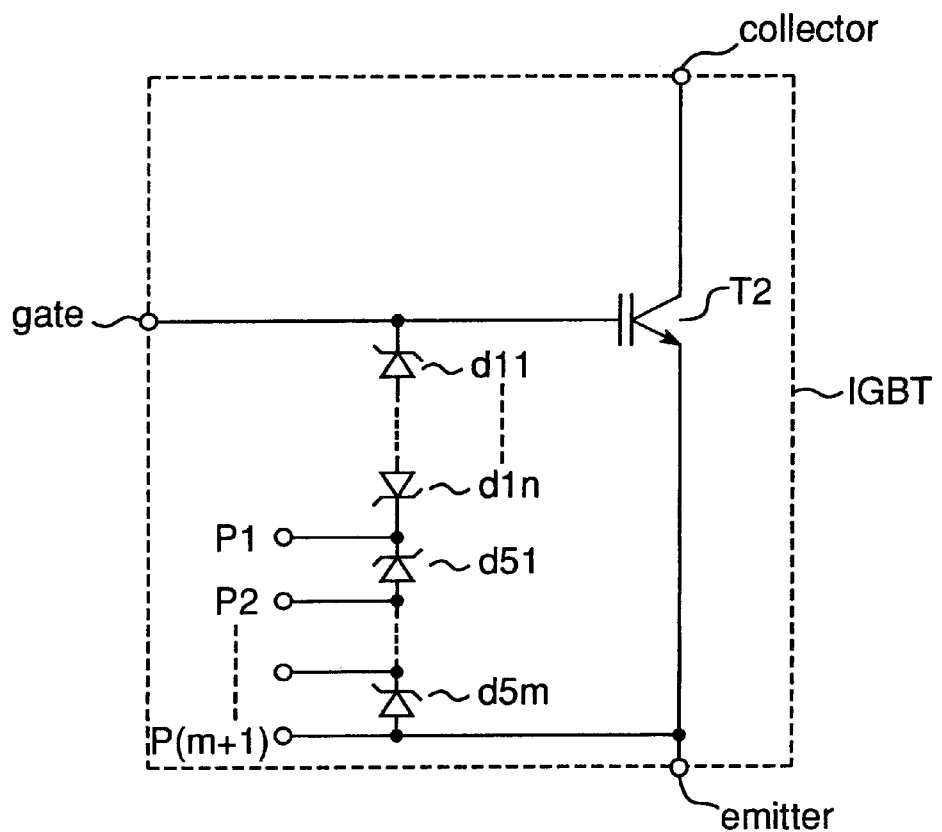
FIG. 11 is a circuit diagram showing an equivalent circuit of the power semiconductor device of the fourth embodiment.

In other words, in the voltage-controlled power semiconductor device of the forth embodiment, as shown in an equivalent circuit in FIG. 11, the diodes d51, d52, d5$m$ are connected in series between the gate and source on the side closer to the emitter electrode.

The voltage-controlled power semiconductor device of the fourth embodiment, configured as described above, has the same functions and effects as the power MOS field effect transistor of the first embodiment.

Moreover, since the withstanding voltage of the IGBT can be set higher than the power MOSFET, the voltage-controlled power semiconductor device of the fourth embodiment can be used in a wider range of applications.

Furthermore, the forth embodiment uses the same construction as the first embodiment in terms of equivalent circuits; however, the present invention is not intended to be limited by this construction, and diodes may be designed so as to have the reversed polarity to the polarity of the diodes d51, d52, ..., d5$m$, in the same manner as the second embodiment. This construction exhibits the same functions and effects as the second embodiment. Further, diodes may be formed by using polysilicon in the same manner as the third embodiment. This construction exhibits the same functions and effects as the third embodiment.

Modification

In the above-mentioned first to fourth embodiments, explanations were given by exemplifying the power MOS field effect transistor or the insulating gate bipolar transistor as a voltage-controlled power semiconductor device. However, the present invention is not intended to be limited by these, and applicable to any semiconductor device as long as it has at least a gate insulator and a zener diode for protecting the film, and requires screening in the manufacturing process.

Moreover, in the above-mentioned first to fourth embodiments, explanations were given by exemplifying cases in which a plurality of diodes were formed as diodes; however, the present invention is not intended to be limited by this, and one diode device may be provided.

What is claimed is:

1. A power semiconductor device comprising:

a semiconductor substrate;

a voltage-controlled transistor having a first electrode formed on the lower surface of said semiconductor substrate, a gate insulated by a gate oxide formed on said semiconductor substrate and a second electrode formed on said semiconductor substrate; and a zener diode formed on the upper surface of said semiconductor substrate so as to be connected between said gate and said second electrode;

wherein p-type regions and n-type regions alternately formed between said zener diode and said second electrode on said semiconductor substrate, a plurality of pad electrodes on said p-type regions and said n-type regions so as to allow one or not less than two diodes are series connected between said zener diode and said second electrode, and the distance between the adjacent pad electrodes is set so that when said diode is subjected to a current not less than a predetermined value, said pad electrodes are fused so that short-circuiting occurs between the adjacent pad electrodes.

2. The power semiconductor device according to claim 1;

wherein the polarity of said respective diodes is the same as the polarity of said zener diode.

3. The power semiconductor device according to claim 1; wherein the adjacent diodes are set to have polarities revered to each other.

4. The power semiconductor device according to claim 3; wherein said gate is formed of polysilicon, and said p-type regions and n-type regions are formed by using polysilicon that is formed simultaneously as the formation of said gate.

5. The power semiconductor device according to claim 1; wherein said voltage-controlled transistor is constructed by using MOS field effect transistor.

6. A power semiconductor device according to claim 1; wherein said voltage-controlled transistor is constructed by using insulating gate bipolar transistors.

* * * * *